United States Patent [19]

Yamanaka

[11] Patent Number: 5,059,906
[45] Date of Patent: Oct. 22, 1991

[54] MAGNETIC RESONANCE IMAGING APPARATUS

[75] Inventor: Kayuri Yamanaka, Ootawara, Japan

[73] Assignee: Kabushiki Kaisha Toshiba, Kawasaki, Japan

[21] Appl. No.: 441,773

[22] Filed: Nov. 27, 1989

[30] Foreign Application Priority Data

Nov. 25, 1988 [JP] Japan .................................. 63-296057
Mar. 22, 1989 [JP] Japan .................................... 1-69804

[51] Int. Cl.$^5$ ............................................. G01R 33/20
[52] U.S. Cl. ....................................................... 324/318
[58] Field of Search .......................... 324/300, 307, 318;
128/653 SC; 248/160, 276; 403/41, 56, 223, 291

[56] References Cited

U.S. PATENT DOCUMENTS 2,533,494 12/1950 Mitchell, Jr. .......................... 248/160

FOREIGN PATENT DOCUMENTS

854100 8/1952 Fed. Rep. of Germany ...... 248/160
3822185 1/1989 Fed. Rep. of Germany ...... 324/318

Primary Examiner—Michael J. Tokar
Attorney, Agent, or Firm—Cushman, Darby & Cushman

[57] ABSTRACT

A retaining mechanism for retaining a surface coil of an MRI apparatus comprises a retaining unit for retaining the surface coil, supporting members each having a distal end connected to the retaining unit to support the same, and a mounting unit connected with the respective proximal ends of the supporting members so that the supporting members are mounted on a bed. Each supporting member is flexible enough to be bent by external force and retentive enough to maintain a bent posture. Thus, by bending the supporting members, the surface coil can be moved to and kept in a desired position. In this arrangement, the surface coil can be quickly moved onto a desired photographing region, and kept accurately on the predetermined region during photographing operation.

11 Claims, 8 Drawing Sheets

MAGNETIC RESONANCE IMAGING APPARATUS

BACKGROUND OF THE INVENTION

1. Field of the Invention

The present invention relates to a magnetic resonance image apparatus (hereinafter referred to as MRI apparatus), and more particularly, to an MRI apparatus having a retaining mechanism for retaining a receiving coil which receives a magnetic resonance signal induced in the body of a patient 2. Description of the Related Art In an MRI apparatus, the body of a patient is situated in a static magnetic field and a gradient magnetic field, and high-frequency pulses are applied to these magnetic fields so that a magnetic resonance signal is induced in the body of the patient. The magnetic resonance signal is detected by means of a receiving coil. The detected signal is processed, so that a desired slice image is obtained.

In photographing very small regions, such as the head, thyroid gland, etc., or in detecting local regions with high sensitivity, a surface coil may be used as the receiving coil of the MRI apparatus. When using the surface coil for the detection of the magnetic resonance signal, the coil must be kept accurately in intimate contact with or in close vicinity to the surface of the region to be photographed.

Conventionally, therefore, the surface coil is pasted on the surface of the region to be photographed by means of adhesive tape or secured to the surface of the region by means of a cord. Alternatively, the surface coil is supported by means of an unbending supporting member so that it is situated on the surface of the predetermined region to be photographed.

In this arrangement, however, an operator may not be able to situate the surface coil quickly on the desired region for photographing, or to keep the coil accurately on the predetermined region during photographing operation.

SUMMARY OF THE INVENTION

The object of the present invention is to provide an MRI apparatus in which a receiving coil for receiving a magnetic resonance signal can be quickly moved onto a desired photographing region, and kept accurately on the predetermined region during photographing operation.

According to the present invention, there is provided a magnetic resonance imaging apparatus comprising a retaining mechanism for retaining receiving means so that the receiving means is situated close to the surface of the body of a patient lying on a bed, the receiving means receiving a magnetic resonance signal induced in the body of the patient, the retaining mechanism including: retaining means for retaining the receiving means; supporting mean for supporting the retaining means, the supporting means having a distal end connected to the retaining means and a proximal end, and being flexible enough to be bent by external force and retentive enough to maintain a bent posture; and mounting means connected to the proximal end of the supporting means and adapted to mount the supporting means on a predetermined portion of the bed, whereby as the supporting means is bent, the receiving means is moved to and kept in a desired position.

Thus, in the present invention, the receiving means can be quickly moved onto a desired photographing region, and kept accurately on the predetermined region during photographing operation.

BRIEF DESCRIPTION OF THE DRAWINGS

FIGS. 12 to 14 show a fourth modification of the supporting member, in which FIGS. 15 to 17 show a retaining mechanism for a surface coil according to a second embodiment of the present invention, in which

DETAILED DESCRIPTION OF THE PREFERRED EMBODIMENTS

A preferred embodiment of the present invention will be described with reference to FIGS. 1 to 14.

Figure 1:
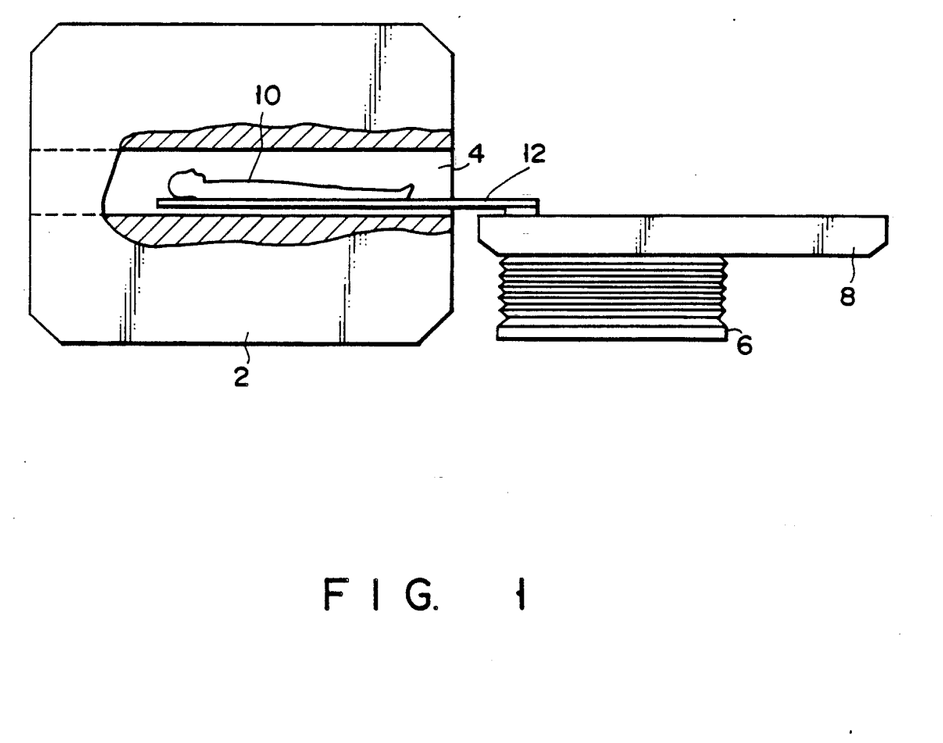
FIG. 1 is a front view of a magnetic resonance imaging apparatus according to the present invention.

Referring to FIG. 1, frame 2 incorporates an image pickup system. Hollow portion 4 is formed in the central portion of frame 2, and an image pickup region is formed in hollow portion 4.

Bed 6 is arranged adjacent to frame 2 and has elevating plate 8 which is vertically movable. Table 12 for carrying patient 10 thereon is arranged on elevating plate 8. Table 12 is supported on plate 8 so as to be horizontally slidable from bed 6 into the image pickup region in frame 2.

Figure 2:
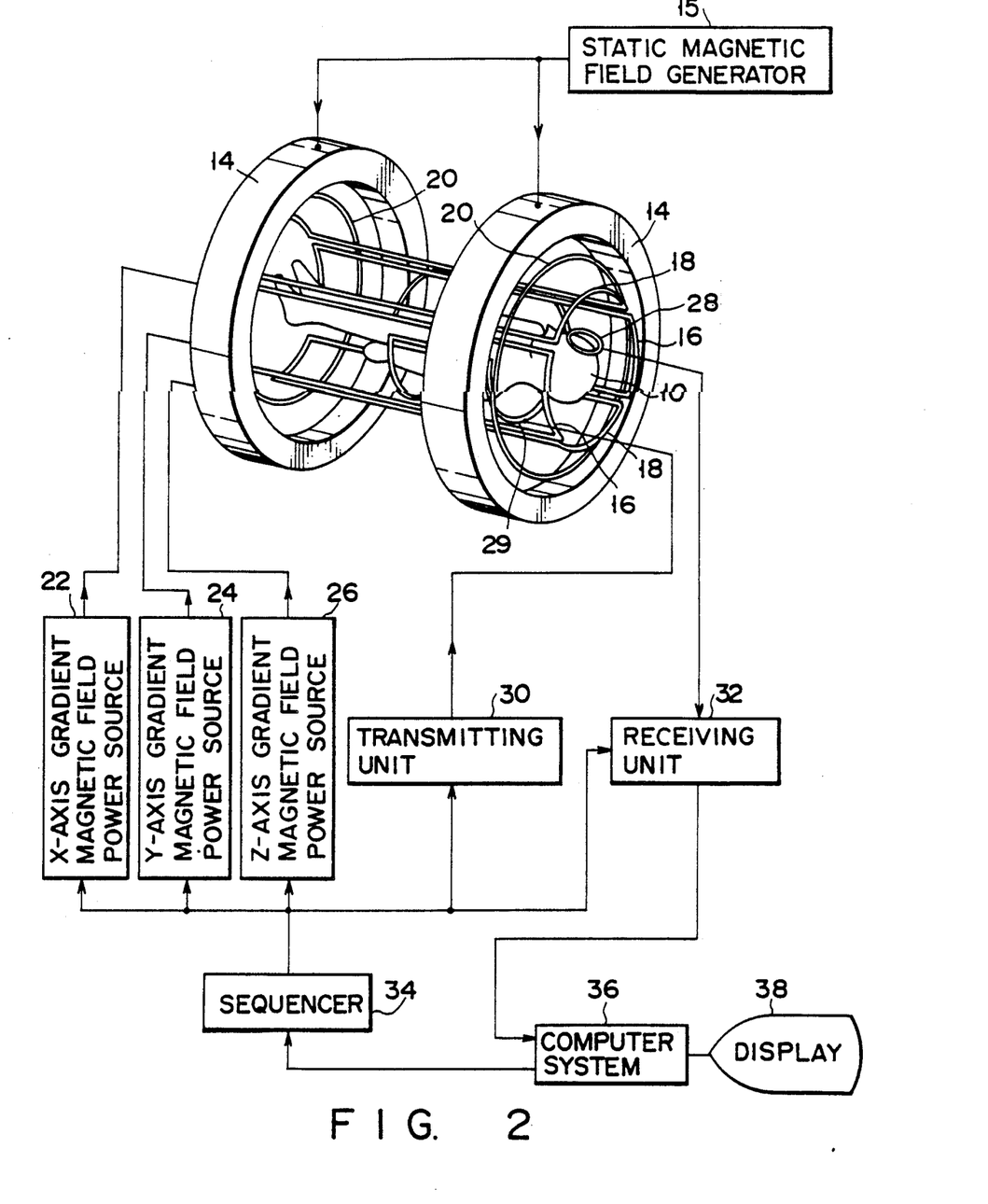
FIG. 2 shows the arrangement of an image pickup system used in the apparatus shown in FIG. 1.

The image pickup system has a pair of ring-shaped static magnetic field generating coils 14 for generating a uniform static magnetic field, as shown in FIG. 2. Coils 14 are connected to static magnetic field power source 15. X-, y-, and z-axis gradient magnetic field generating coils 16, 18, and 20 for generating x-, y-, and z-axis gradient magnetic fields, respectively, are arranged in a region defined inside coils 14. Coils 16, 18, and 20 are electrically connected to x-, y-, and z-axis gradient magnetic field power sources 22, 24, and 26, respectively.

Reference numeral 29 denotes a transmitting coil for transmitting a signal used for generating a rotating magnetic field. Reference numeral 28 denotes a surface coil, which serves as a receiving coil for receiving a magnetic resonance signal induced in the body of patient 10. Coil 28 is connected to receiving unit 32 for receiving a detection signal. Power sources 22, 24, and 26 and units 30 and 32 are connected to sequencer 34 to be driven with desired pulse sequences. Sequencer 34 receives a control signal from computer system 36. Computer system 36 receives a detection signal from receiving/transmitting unit 32. The detection signal is processed by computer system 36. Based on the processed detection signal, a tomographic image of the body of patient 10 is displayed on display 38.

Figure 3:
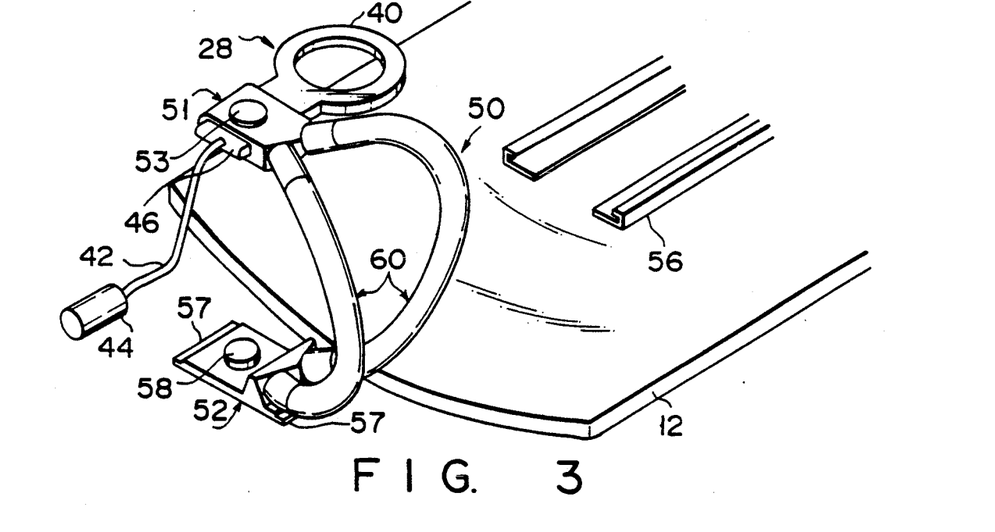
FIG. 3 is a perspective view showing a retaining mechanism for a surface coil according to a first embodiment of the present invention and a table of a bed.

As shown in FIG. 3, surface coil 28 has detecting section 40 detecting section 40 is obtained by molding a ring-shaped coil (not shown) on a ring-shaped member of a resin or the like. Coil 28 is connected to one end of cable 42, and the other end of cable 42 is connected to connector 44. Coil 28 is detachably connected to the image pickup system through connector 44.

Figure 4:
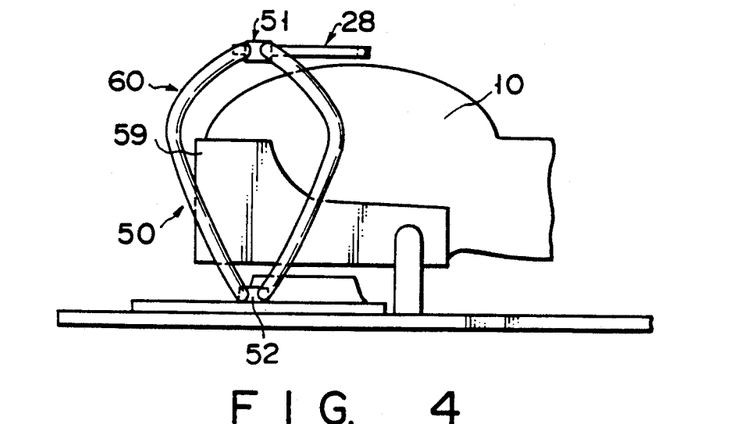
FIGS. 4 and 5 are schematic views showing a state in which the surface coil is situated at a desired photographing position on the body of a patient.
Figure 5:
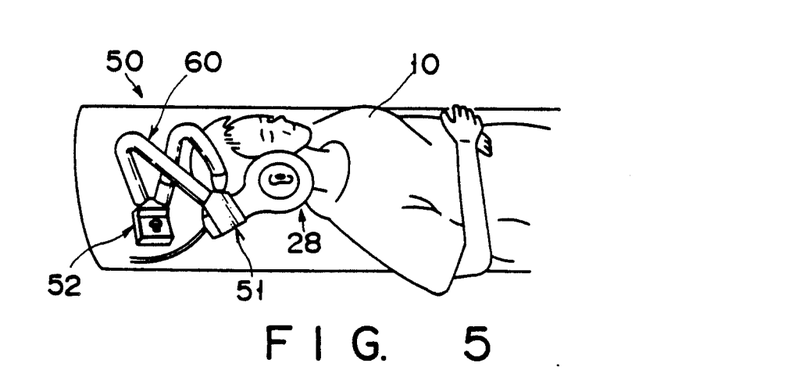

As shown in FIG. 4 or 5, surface coil 28 is arranged near the head of patient 10. The body of patient 10 is placed in a uniform magnetic field generated by static magnetic field generating coils 14 in the image pickup region of the image pickup system. In this state, transmitting unit 30 is driven by a pulse sequence of sequencer 34. Ninety-degree- and 180°-pulses as the rotating magnetic field are applied to patient 10 by transmitting coil 29. At the same time, x-, y-, and z-axis gradient magnetic field power sources 22, 24, and 26 are separately driven, and x, y-, and z-axis gradient magnetic fields are applied by x, y-, and z-axis gradient magnetic field generating coils 16, 18, and 20, respectively. A magnetic resonance occurs in the body of patient 10, and a magnetic resonance signal induced by the magnetic resonance phenomenon is detected by coil 28. The detection signal is fetched by computer system 36. Signal processing, e.g., image reconstruction, is performed by computer system 36. Thus, projection information of a predetermined slice of the body of patient 10 is obtained. When image reconstruction of the information is performed, image information reflecting a spin density and/or a relaxation time constant of a specific atomic nucleus is obtained.

The following is a description of retaining mechanism 50 for surface coil 28 according to the present invention.

As shown in FIG. 3, retaining mechanism 50 includes retaining unit 51 for retaining surface coil 28, two flexible supporting members 60 each having a distal end connected to retaining unit 51 to support the same, and mounting unit 52 connected with the respective proximal ends of supporting members 60 so that members 60 are mounted on table 12. All the components of retaining mechanism 50 are formed of a nonmagnetic material immune from magnetism, e.g., resin.

Retaining unit 51 has a hole in which grip 46 of surface coil 28 is inserted. In this state, screw 53 is tightened so that coil 28 is retained by unit 51.

Figure 8A:
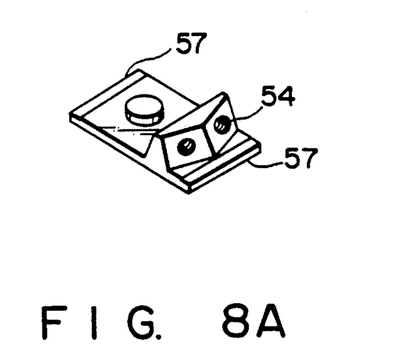
FIG. 8A is a perspective view of a mounting unit included in the retaining mechanism.
Figure 8B:
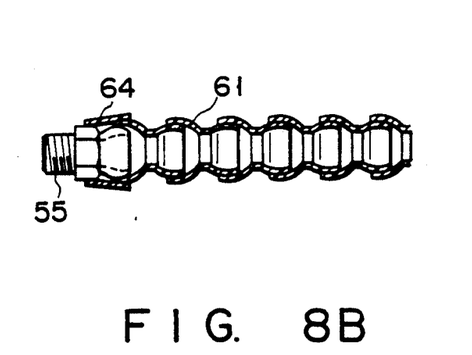
FIG. 8B is a sectional view of the proximal end of the supporting member connected to the mounting unit.

As shown in FIGS. 8A and 8B, mounting unit 52 has two tapped holes 54, in which male screws 55 at the respective proximal ends of supporting members 60 are threadedly fitted, individually. Also, retaining unit 51 and the respective distal ends of supporting members 60 are connected by means of a screw (not shown).

Mounting unit 52 includes screw 58 and sliding portions 57 slidable on guide rails 56. Unit 52 can be mounted on any desired position of table 12 by tightening screw 58 on the table after setting sliding portions 57 on rails 56. Means for mounting the mounting unit on the table is not limited to this arrangement, and the mounting unit may be mounted by means of clips or Velcro fasteners. Alternatively, mounting unit 52 may be mounted on headrest 59 for supporting the head of the patient.

Figure 6:
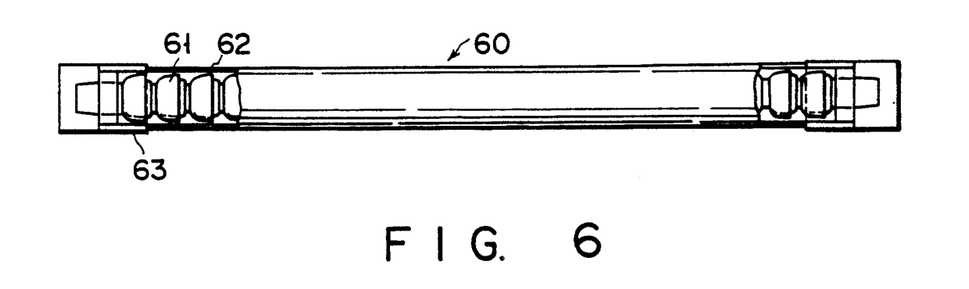
FIG. 6 is a front view, partially in section, showing a supporting member included in the retaining mechanism.
Figure 7A:
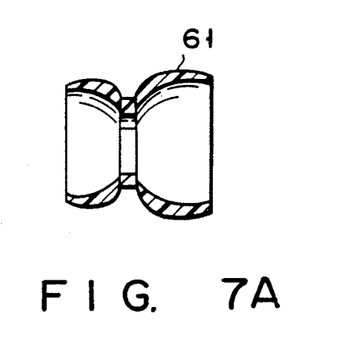
FIGS. 7A and 7B are sectional views showing frictional engaging segments of the supporting member.
Figure 7B:
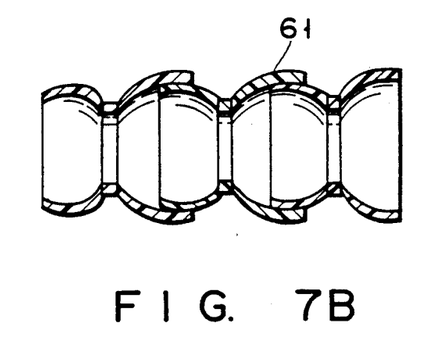

As shown in FIG. 6, each supporting member 60 includes plurality of engaging segments (or first flexible members) 61 connected to one another. As shown in FIGS. 7A and 7B, each segment 61 is in frictional engagement with segments 61 adjacent thereto. Thus, supporting members 60, each composed of connected engaging segments 61, are flexible enough to be bent freely by an operator's strength resisting the frictional force, and at the same time, are retentive enough to be kept bent by the frictional force.

If the operator grips and moves retaining unit 51 to situate surface coil 28 in a predetermined position, therefore, supporting members 60 are bent following the movement of unit 51. When retaining unit 51 reaches a predetermined position, members 60 are kept in the bent state, so that coil 28 is kept in the predetermined position thereof.

Thus, surface coil 28 can be quickly moved onto a desired photographing region, and kept accurately on the predetermined region during photographing operation.

If surface coil 28 is relatively heavy in weight, the retentivity of supporting members 60 may possibly be too low to keep coil 28 in the predetermined position. The retentivity may be enhanced by increasing the frictional force of engaging segments 61. If the frictional force is increased, however, the operator must apply a greater force to supporting members 60. Thus, the operating efficiency is lowered, so that the surface coil sometimes cannot be quickly moved.

Thereupon, various means are used to increase the retentivity of supporting members 60 without substantially lowering the operating efficiency.

As shown in FIG. 6, each supporting member 60 has cylindrical covering member 62 which covers engaging segments 61. Member 62 is not only flexible enough to be bent by external force, but also elastic to a degree such that it tends to be restored to its original posture. Thus, covering member 62 can give elasticity (strength of stability) to supporting member 60. Accordingly, the retentivity of supporting members 60 is somewhat increased.

The covering member further provides the following effects.

First, connected engaging segments 61 produce frictional sounds when each supporting member 60 is bent. Covering member 62 serves to prevent the frictional sounds from leaking out. In this case, if member 62 is formed of a material of high sound-absorbing power, the effect of sound insulation can be further improved.

Secondly, connected engaging segments 61 may possibly be disengaged from one another if supporting member 60 is bent beyond a certain degree. Covering these engaging segments, however, covering member 62 can preclude the possibility of such an awkward situation.

Thirdly, grease may be applied to connected engaging segments 61. In this case, the grease is contained covering member 62, so that there is no possibility of its soiling the body or clothes of the operator. The grease makes the frictional engagement between engaging segments 61 smooth and removes the frictional sounds (creaking sounds) of segments 61.

Fourthly, since covering member 62 covers engaging segments 61, the junctions of segments 61 are prevented from biting the operator's hair or skin.

Fifthly, the operator can enjoy an improved feeling of hold, and the supporting members have an improved external appearance.

Covering member 62 must only be formed of a non-magnetic material which is flexible enough to be bent by external force and somewhat elastic. Thus, member 62 may be formed of Teflon, vinyl, silicone, rubber, cloth, etc. Since the covering member sometimes may be cleaned with alcohol, it should preferably be resistant to chemicals.

As shown in FIG. 6, moreover, flexible pipe 63 is attached to each end of covering member 62. Pipes 63 allow member 62 to move without restriction. As shown in FIG. 8B, moreover, heat-shrinkable tube 64 is attached to the junction of screw 55 and engaging segments 61. Thus, the end portion of each supporting member 60 is prevented from being bent.

Figure 9:
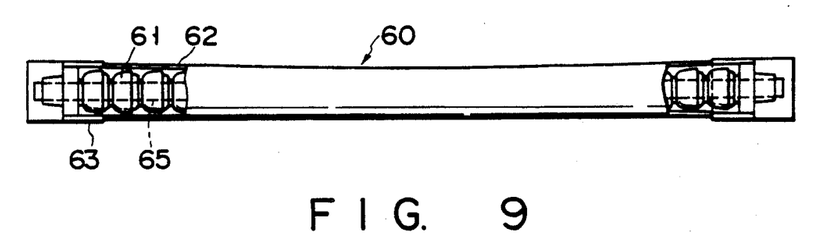
FIG. 9 is a front view, partially in section, showing a first modification of the supporting member.

As shown in FIG. 9, furthermore, each supporting member 60 may be provided with second flexible member 65 which is passed through engaging segments 61. Member 65, which is a rod of soft resin, is flexible enough to be bent by external force and elastic to a degree such that it tends to be restored to its original posture. The elastic force of member 65 is not, however, great enough to spring supporting member 60 when the supporting member is bent. Second flexible member 65 cannot bend beyond a predetermined curvature. Since neither end of member 65 is fixed, member 65 can freely bend in engaging segments 61.

Thus, enjoying the elasticity (strength of stability) of second flexible member 65, supporting member 60 has enhanced retentivity. Moreover, the force applied to supporting members 60 by the operator while the operator is moving surface coil 28 is somewhat increased to resist the elastic force. Practically, however, the force of the operator cannot be increased so much as to influence the operating efficiency. Since second flexible member 65 cannot bend beyond the predetermined curvature, moreover, connected engaging segments 61 are prevented from being disengaged when supporting member 60 is bent beyond a certain degree.

Figure 10:
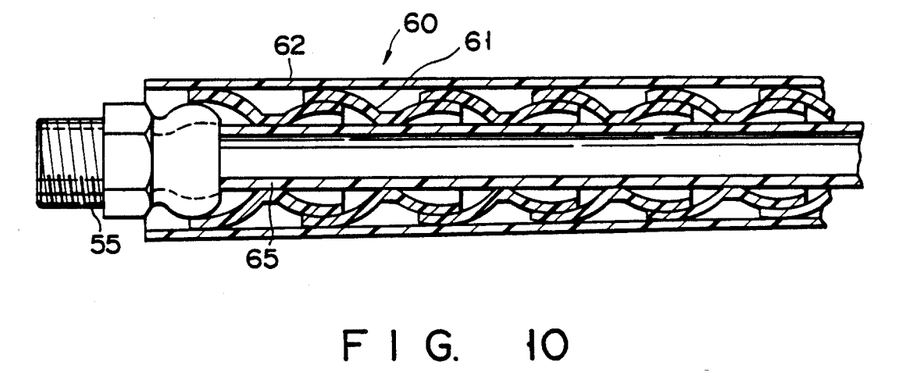
FIG. 10 is a sectional view showing a second modification of the supporting member.

As shown in FIG. 10, moreover, second flexible member 65 in engaging segments 61 may be in the form of a hollow cylinder. Also in this case, the retentivity of supporting member 60 is enhanced by the elasticity (strength of stability) of member 65 without lowering the operating efficiency.

Figure 11:
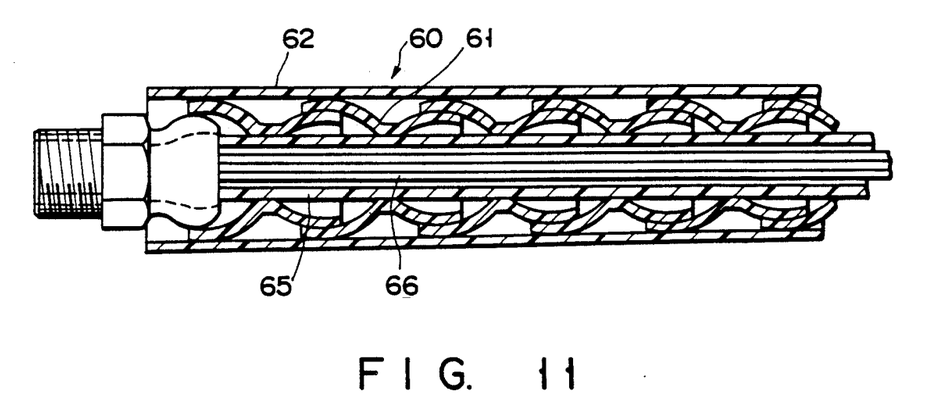
FIG. 11 is a sectional view showing third modification of the supporting member.

As shown in FIG. 11, furthermore, a plurality of cores 66 may be passed through cylindrical second flexible member 66. Each core 66, which is formed of a Teflon rod, is flexible enough to be bent by external force and elastic to a degree such that it tends to be restored to it original posture. The diameter and number of cores 66 are set to values such that supporting member 60 cannot be sprung by the cores when it is bent.

Thus, also in this case, supporting member 60 enjoys the elasticity (strength of stability) of second flexible member 65 and cores 66, so that its retentivity is enhanced without lowering the operating efficiency.

Figure 12:
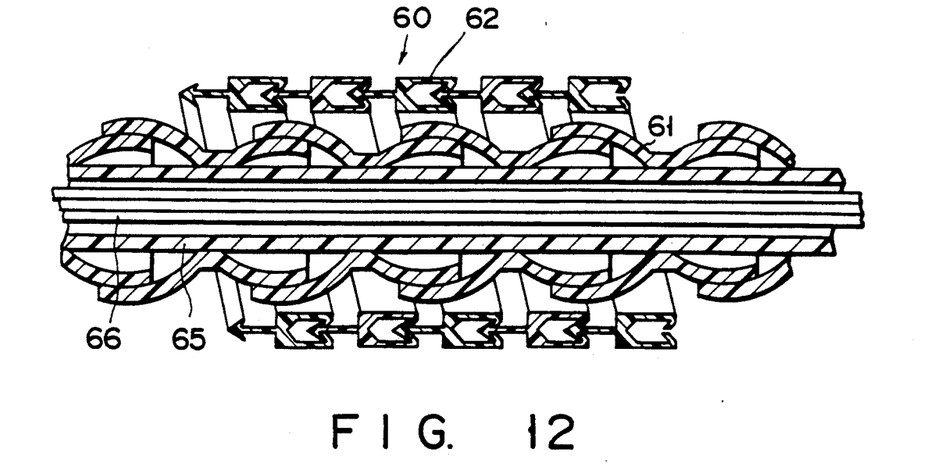
FIG. 12 is a sectional view of the supporting member with a covering member in a stretched state.
Figure 13:
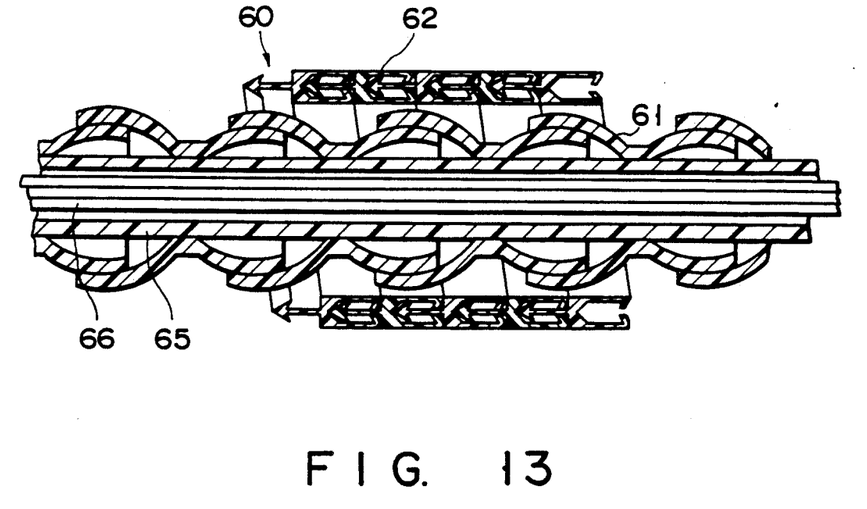
FIG. 13 is a sectional view of the supporting member with the covering member in a contracted state.
Figure 14:
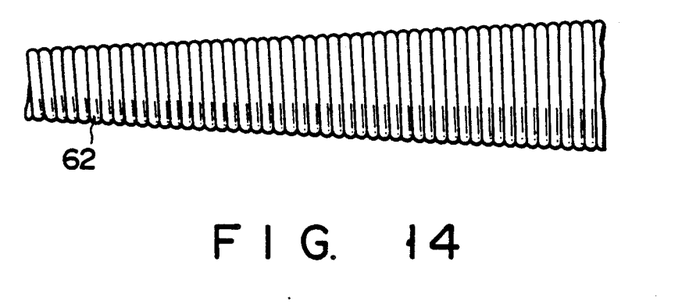
FIG. 14 is a front view of the covering member with a varying diameter.

As shown in FIGS. 12 to 14, moreover, covering member 62 may be formed of a spiral member. The spiral member is composed of a plurality of ring-shaped segments in engagement with one another. Thus, the spiral member can be extended or contracted in its axial direction, as shown in FIG. 12 or 13. As shown in FIG. 14, moreover, the diameter of the spiral member can be varied.

Accordingly, covering member 62 is not only flexible enough to be bent freely by external force, but also retentive enough to be kept bent. Thus, by the cooperation of covering member 62, second flexible member 65, and cores 66, the retentivity of supporting member 60 is enhanced without lowering the operating efficiency.

In this arrangement, the surface coil can be quickly moved onto the desired photographing region, and kept accurately on the predetermined region during the photographing operation.

Although the two supporting members are used in the embodiment described above, the present invention is not limited to this, and one or three or more supporting members may be used with the same result.

Figure 15:
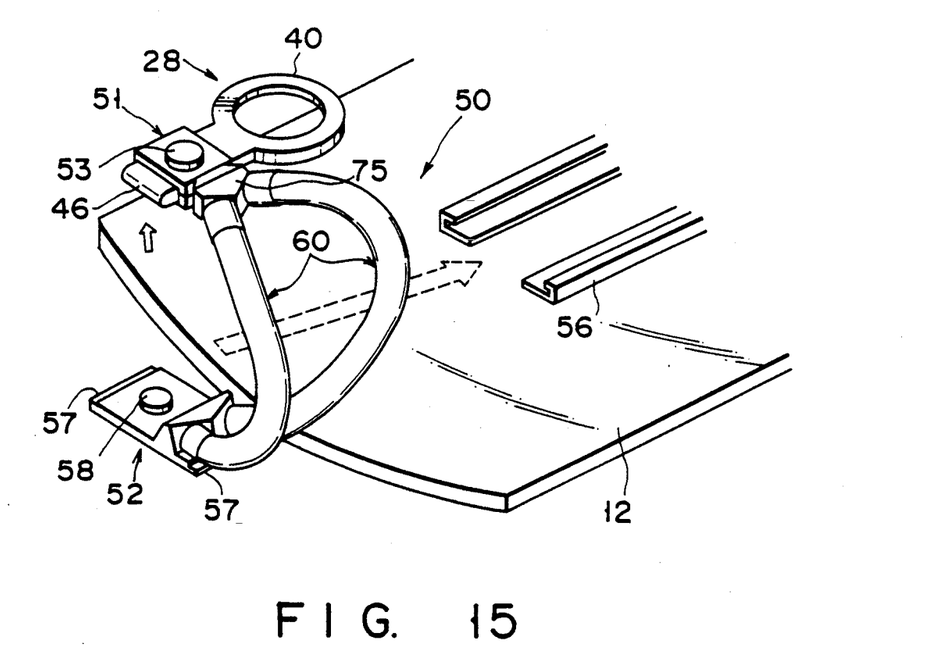
FIG. 15 is a perspective view showing the retaining mechanism and a table of a bed.
Figure 16:
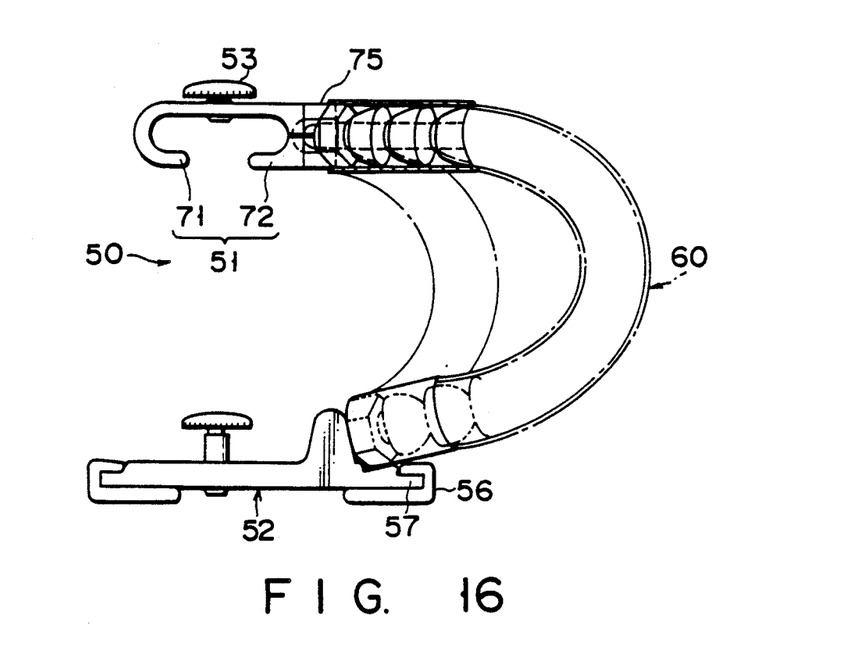
FIG. 16 is a front view, partially in section, showing the retaining mechanism.
Figure 17:
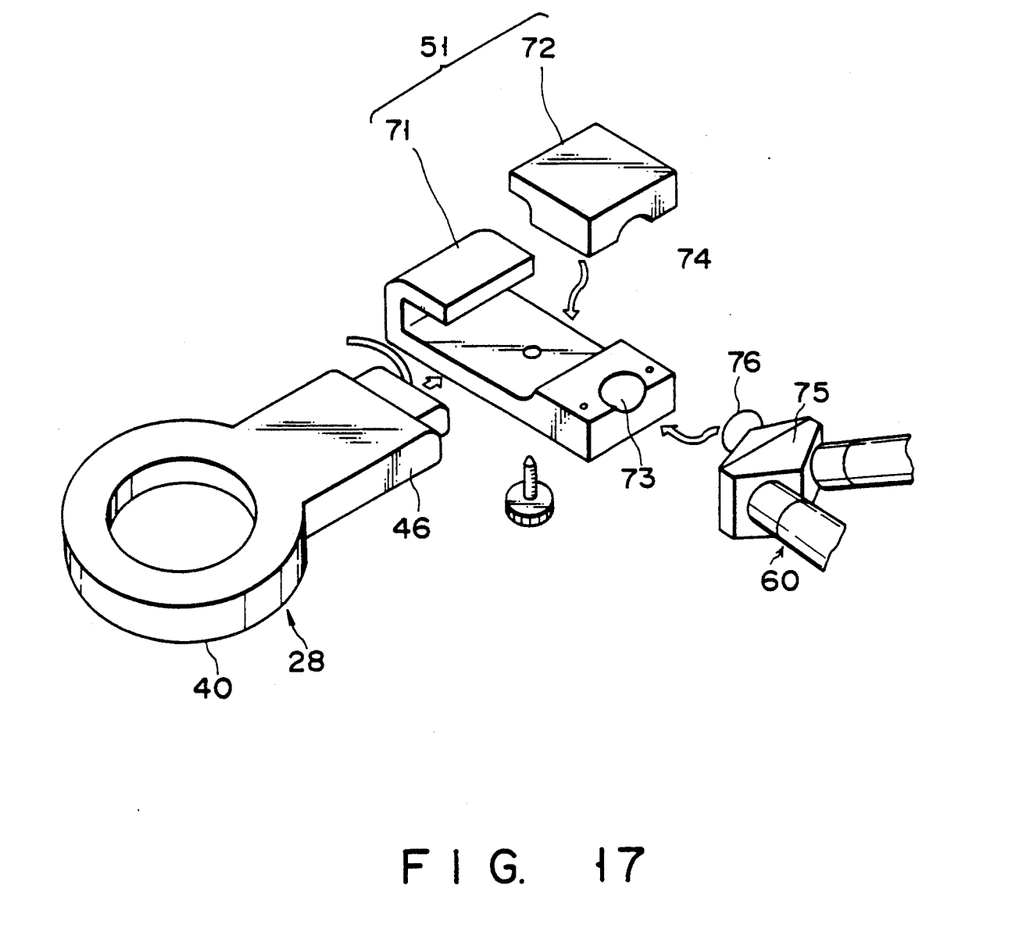
FIG. 17 is an exploded perspective view showing the surface coil and a retaining unit.

FIGS. 15 to 17 show a second embodiment of the present invention. This second embodiment is intended to effect fine adjustment of the position of surface coil 28 without bending supporting members 60.

As shown in FIG. 17, retaining unit 51 for retaining surface coil 28 includes main and auxiliary members 71 and 72 which have hemispheric depressions 73 and 74, respectively. Connecting member 75, which is connected with the respective distal ends of supporting members 60, is formed having sphere 76. Auxiliary member 72 is mounted on main member 71 so that sphere 76 is situated between hemispheric depressions 73 and 74. Thus, sphere 76 and depressions 73 and 74 constitute a spheric joint (universal joint). In this arrangement, only retaining unit 51 can be rotated by means of the spheric joint without bending supporting members 60.

After supporting members 60 are bent so that surface coil 28 is located substantially in the predetermined position, therefore, only retaining unit 51 can be rotated, by means of the spheric joint, to change the direction of coil 28.

Since the position of surface coil 28 can be finely adjusted without bending supporting members 60, the fine adjustment can be executed much more easily than in the first embodiment.

The spheric joint may alternatively be provided at the junction between mounting unit 52 and the respective proximal ends of supporting members 60. Alternatively, moreover, the spheric joint may be provided on bed 6 or frame 2.

What is claimed is:

1. A magnetic resonance imaging apparatus comprising a retaining mechanism for retaining receiving means so that the receiving means is situated close to the surface of the body of a patient lying on a bed, said receiving means receiving a magnetic resonance signal induced in the body of the patient, said retaining mechanism including:
retaining means for retaining the receiving means;
supporting means for supporting the retaining means, said supporting means having a distal end connected to the retaining means and a proximal end, said supporting means including a first flexible member flexible enough to be bent by external force and retentive enough to maintain a bent posture, and a flexible cylindrical covering member covering the first flexible member, said first flexible member having a plurality of cylindrical engaging segments in frictional engagement with one another so as to define a hollow cylinder, and said supporting means further includes a second flexible member inserted in the cylindrical first flexible member, said second flexible member being flexible enough to be bent by external force and elastic to a degree such that the second flexible member tends to be restored to the original posture thereof; and mounting means connected to the proximal end of the supporting means and adapted to mount the supporting means on a predetermined portion of the bed, whereby as the supporting means is bent, said receiving means is moved to and kept in a desired position.

2. A magnetic resonance imaging apparatus according to claim 1, wherein said first flexible member is constructed as an elongated spiral member.

3. A retaining mechanism for retaining receiving means so that the receiving means is situated close to the surface of the body of a patient lying on a bed, said receiving means receiving a magnetic resonance signal induced in the body of the patient, comprising:

retaining means for retaining the receiving means;

supporting means for supporting the retaining means, said supporting means having a distal end connected to the retaining means and a proximal end, and said supporting means including a first flexible member flexible enough to be bent by external force and retentive enough to maintain a bent posture, and a flexible cylindrical covering member covering the first flexible member;

said first flexible member having a plurality of cylindrical engaging segments in frictional engagement with one another, said first flexible member being in the form of a hollow cylinder, and said supporting means further includes a second flexible member inserted in the cylindrical first flexible member, said second flexible member being flexible enough to be bent by external force and elastic to a degree such that the second flexible member tends to be restored to the original posture thereof; and mounting means connected to the proximal end of the supporting means and adapted to mount the supporting means on a predetermined portion of the bed;

whereby as the supporting means is bent, said receiving means is moved to and kept in a desired position.

4. The retaining mechanism according to claim 3, where in said second flexible member is solid.

5. The retaining mechanism according to claim 3, wherein said second flexible member is in the form of a hollow cylinder, and said supporting means further includes a plurality of cores inserted in the cylindrical second flexible member, each said core being flexible enough to be bent by external force and elastic to a degree such that the core tends to be restored to the original posture thereof.

6. The imaging apparatus according to claim 1, wherein said second flexible member is solid.

7. The imaging apparatus according to claim 1, wherein said second flexible member is in the form of a hollow cylinder, and said supporting means further includes plurality of cores inserted in the cylindrical second flexible member, each said core being flexible enough to be bent by external force and elastic to a degree such that the core tends to be restored to the original posture thereof.

8. The imaging apparatus according to claim 1, wherein said cylindrical covering member is elastic with respect to both the axial and radial directions thereof.

9. The imaging apparatus according to claim 1, further comprising a universal joint for achieving one of the connection between the distal end of the supporting means and the retaining means and the connection between the proximal end of the supporting means and the mounting means.

10. The imaging apparatus according to claim 9, wherein said universal joint is a spheric joint.

11. The retaining mechanism according to claim 3, further comprising a universal joint for the connection between the distal end of the supporting means and the retaining means or between the proximal end of the supporting means and the mounting means.

* * * * *